(12) United States Patent
Ooyagi et al.

(10) Patent No.: US 8,030,976 B2
(45) Date of Patent: Oct. 4, 2011

(54) TRIANGLE WAVE GENERATING CIRCUIT

(75) Inventors: Mitsuru Ooyagi, Fukaya (JP); Tomoaki Nishi, Nagaoka (JP)

(73) Assignees: Sanyo Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 3 days.

(21) Appl. No.: 12/691,544

(22) Filed: Jan. 21, 2010

(65) Prior Publication Data

US 2010/0182054 A1 Jul. 22, 2010

(30) Foreign Application Priority Data

Jan. 22, 2009 (JP) ................................. 2009-012281

(51) Int. Cl.
*H03K 4/06* (2006.01)

(52) U.S. Cl. ....................................... 327/131; 327/132
(58) Field of Classification Search .................. 327/131, 327/132

See application file for complete search history.

(56) References Cited

U.S. PATENT DOCUMENTS

2007/0109029 A1 * 5/2007 Stanley ......................... 327/131

FOREIGN PATENT DOCUMENTS

JP 2007-174853 7/2007

* cited by examiner

*Primary Examiner* — Lincoln Donovan
*Assistant Examiner* — John Poos
(74) *Attorney, Agent, or Firm* — SoCal IP Law Group LLP; Steven C. Sereboff; John E. Gunther

(57) ABSTRACT

A triangle wave generating circuit comprising: a pulse generating circuit configured to generate a plurality of pulse signals with the same period and with phases different from one another; and a plurality of charge/discharge circuits configured to be supplied with the plurality of pulse signals, respectively, the plurality of charge/discharge circuits each including: a current supply circuit configured to supply to a capacitor a first current for charging at a predetermined current value or a second current for discharging at a predetermined current value; and a charge/discharge control circuit configured to switch between the first current and the second current when the pulse signals are supplied thereto and when a voltage across the capacitor reaches a predetermined reference voltage, the first current and the second current supplied from the current supply circuit to the capacitor.

10 Claims, 15 Drawing Sheets

TRIANGLE WAVE GENERATING CIRCUIT

CROSS-REFERENCE TO RELATED APPLICATION

This application claims the benefit of priority to Japanese Patent Application No. 2009-12281, filed Jan. 22, 2009, of which full contents are incorporated herein by reference.

BACKGROUND OF THE INVENTION

1. Field of the Invention

The present invention relates to a triangle wave generating circuit.

2. Description of the Related Art

A switching power supply that generates a desired direct-current voltage by a PWM (Pulse Width Modulation) control is generally known as a power supply for generating a direct-current voltage used in electronic equipment such as a personal computer. For example, Japanese Patent Application Laid-Open Publication No. 2007-174853 discloses a DC-DC convertor that compares a smoothed output voltage and a triangle wave or a saw-tooth wave by a PWM comparator and controls on and off of a switching device according to an output of the PWM comparator.

As such, a PWM signal may be generated using the triangle wave or the saw-tooth wave as a signal for voltage comparison with the output voltage so that the desired direct-current voltage may be generated.

In such electronic equipment as to incorporate a number of electronic circuits, it is desirable from a view-point of reducing maximum power consumption of the electronic equipment as a whole that a plurality of switching power supplies, which are PWM-controlled with phases different from one another, are incorporated, to disperse loads connected to each of the switching power supplies. As illustrated in FIG. 13 or 14, for example, the PWM control may be performed with phases shifted by 180° from each other by outputting the triangle wave TW1 from a common triangle wave generating circuit 8a or 8b and outputting from an inverting amplifier circuit 9 the triangle wave TW2 obtained by inverting the triangle wave TW1.

As illustrated in B2 and C2 of FIG. 15, for example, however, when the triangle wave TW1 input to the inverting amplifier circuit 9 is not a symmetrical triangle wave, the triangle wave TW2 output from the inverting amplifier circuit 9 does not form a triangle wave with a phase shifted by 180° relative to the phase of the triangle wave TW1, and thus, the PWM control may not be performed with the phases shifted by 180° from each other. As illustrated in B and C of FIG. 16, for example, when the triangle wave TW1 has a high frequency (short period), the triangle wave TW2 has a rounded waveform due to the slew rate, etc., of an operational amplifier 90, and thus, accuracy of the PWM control will be reduced.

For this reason, in the case of using a plurality of switching power supplies that are PWM-controlled with the phases different from one another, asymmetrical triangle waves including the saw-tooth wave may not be used as the signal for the voltage comparison and the switching power supplies may not be increased in switching frequency.

SUMMARY OF THE INVENTION

A triangle wave generating circuit according to an aspect of the present invention, comprises: a pulse generating circuit configured to generate a plurality of pulse signals with the same period and with phases different from one another; and a plurality of charge/discharge circuits configured to be supplied with the plurality of pulse signals, respectively, the plurality of charge/discharge circuits each including: a current supply circuit configured to supply to a capacitor a first current for charging at a predetermined current value or a second current for discharging at a predetermined current value; and a charge/discharge control circuit configured to switch between the first current and the second current when the pulse signals are supplied thereto and when a voltage across the capacitor reaches a predetermined reference voltage, the first current and the second current supplied from the current supply circuit to the capacitor.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

First Embodiment

Here, as a first embodiment of the present invention, a triangle wave generating circuit will be described that outputs two triangle waves with the same period and with phases shifted by 180° from each other. A configuration will hereinafter be described of the triangle wave generating circuit according to an embodiment of the present invention with reference to FIG. 1.

Figure 1:
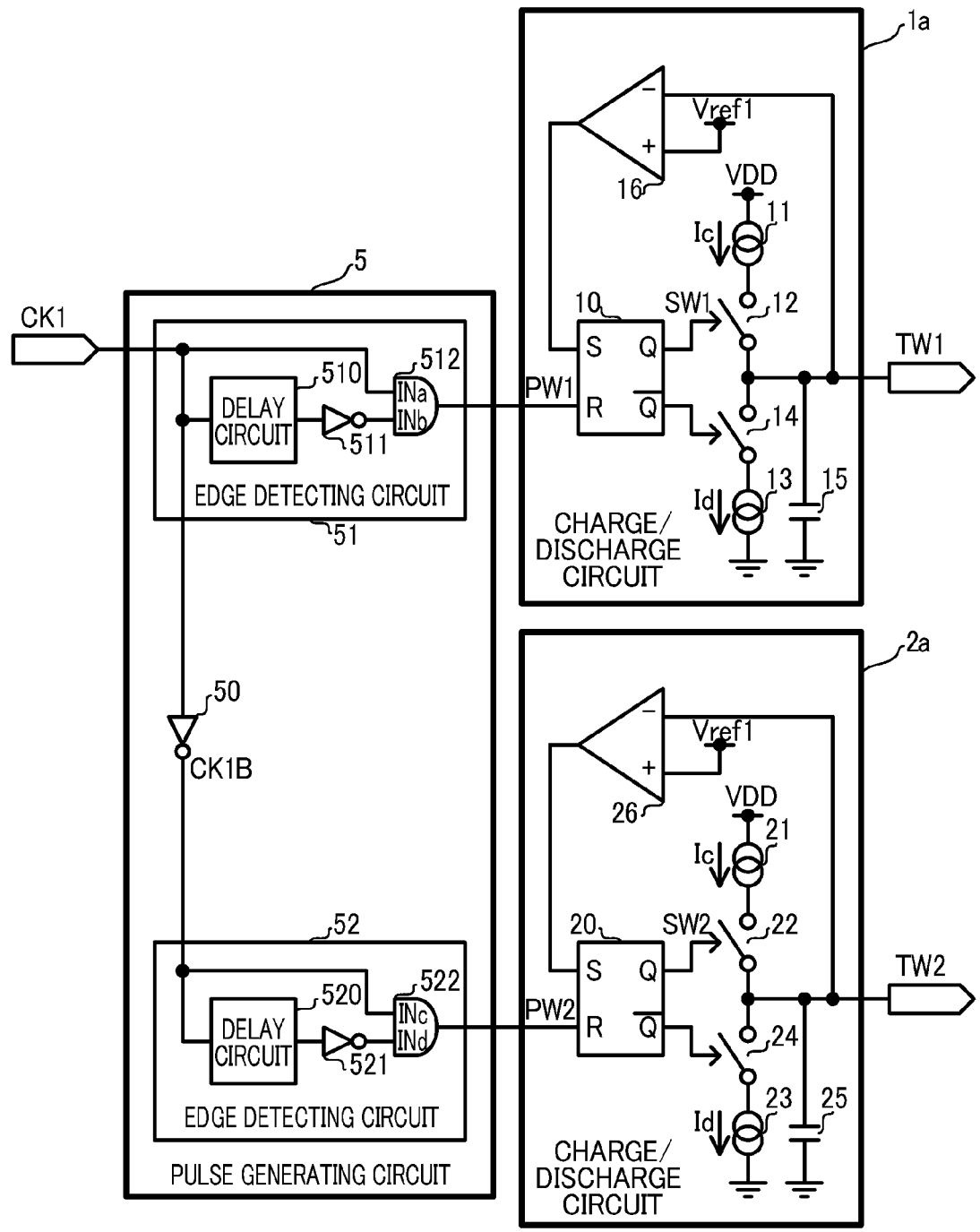
FIG. 1 is a circuit block diagram illustrating a configuration of a triangle wave generating circuit according to a first embodiment of the present invention.

The triangle wave generating circuit illustrated in FIG. 1 includes a pulse generating circuit 5 and charge/discharge circuits 1a and 2a.

The pulse generating circuit 5 includes, for example, a (first) edge detecting circuit 51, an inverter (inverting circuit) 50, and a (second) edge detecting circuit 52 in an embodiment of the present invention.

The edge detecting circuit 51 includes, for example, a delay circuit 510, an inverter 511, and an AND circuit (logical AND circuit) 512. A clock signal CK1 is input to the delay circuit 510 and the output signal of the delay circuit 510 is input to the inverter 511. The clock signal CK1 is input to one input INa of the AND circuit 512, the output signal of the inverter 511 is input to the other input INb, and the output signal of the AND circuit 512 is input to the charge/discharge circuit 1a as a pulse signal PW1.

The clock signal CK1 is input to the inverter 50 and the output signal of the inverter 50 is input to the edge detecting circuit 52 as an inverted clock signal CK1B.

The edge detecting circuit 52 includes, for example a delay circuit 520, an inverter 521, and an AND circuit 522. The inverted clock signal CK1B is input to the delay circuit 520 and the output signal of the delay circuit 520 is input to the inverter 521. The inverted clock signal CK1B is input to one input INc of the AND circuit 522, the output signal of the inverter 521 is input to the other input INd, and the output signal of the AND circuit 522 is input to the charge/discharge circuit 2a as a pulse signal PW2.

The charge/discharge circuit 1a includes, for example, an RSFF (RS flip-flop) 10, current sources 11 and 13, switch circuits 12 and 14, a capacitor 15, and a comparator 16 in an embodiment of the present invention. In the RSFF 10, the output signal of the comparator 16 is input to a S input (set input) thereof and the pulse signal PW1 is input to a R input (reset input) thereof and a non-inverted output signal thereof and an inverted output signal thereof serve as control signals of the switch circuits 12 and 14, respectively. The current source 11 connected to a power source potential VDD, the switch circuit 12, the switch circuit 14, and the current source 13 connected to a ground potential are connected in series in the above order. The comparator 16 has an inverted input thereof connected to a connection point of the switch circuits 12 and 14 and a non-inverted input thereof applied with a reference voltage Vref1, and an output signal thereof is input to the S input of the RSFF 10 as described above. The capacitor 15 has one end thereof connected to the connection point of the switch circuits 12 and 14 and the other end thereof connected to the ground potential, and the voltage across the capacitor is output from the charge/discharge circuit 1a as a triangle wave TW1.

The charge/discharge circuit 2a includes, for example, an RSFF 20, current sources 21 and 23, switch circuits 22 and 24, a capacitor 25, and a comparator 26 in an embodiment of the present invention. The charge/discharge circuit 2a is connected in the same manner as the charge/discharge circuit 1a is and the pulse signal PW2 is input to the R input of the RSFF 20 and the voltage across the capacitor 25 is output from the charge/discharge circuit 2a as a triangle wave TW2.

Figure 2:
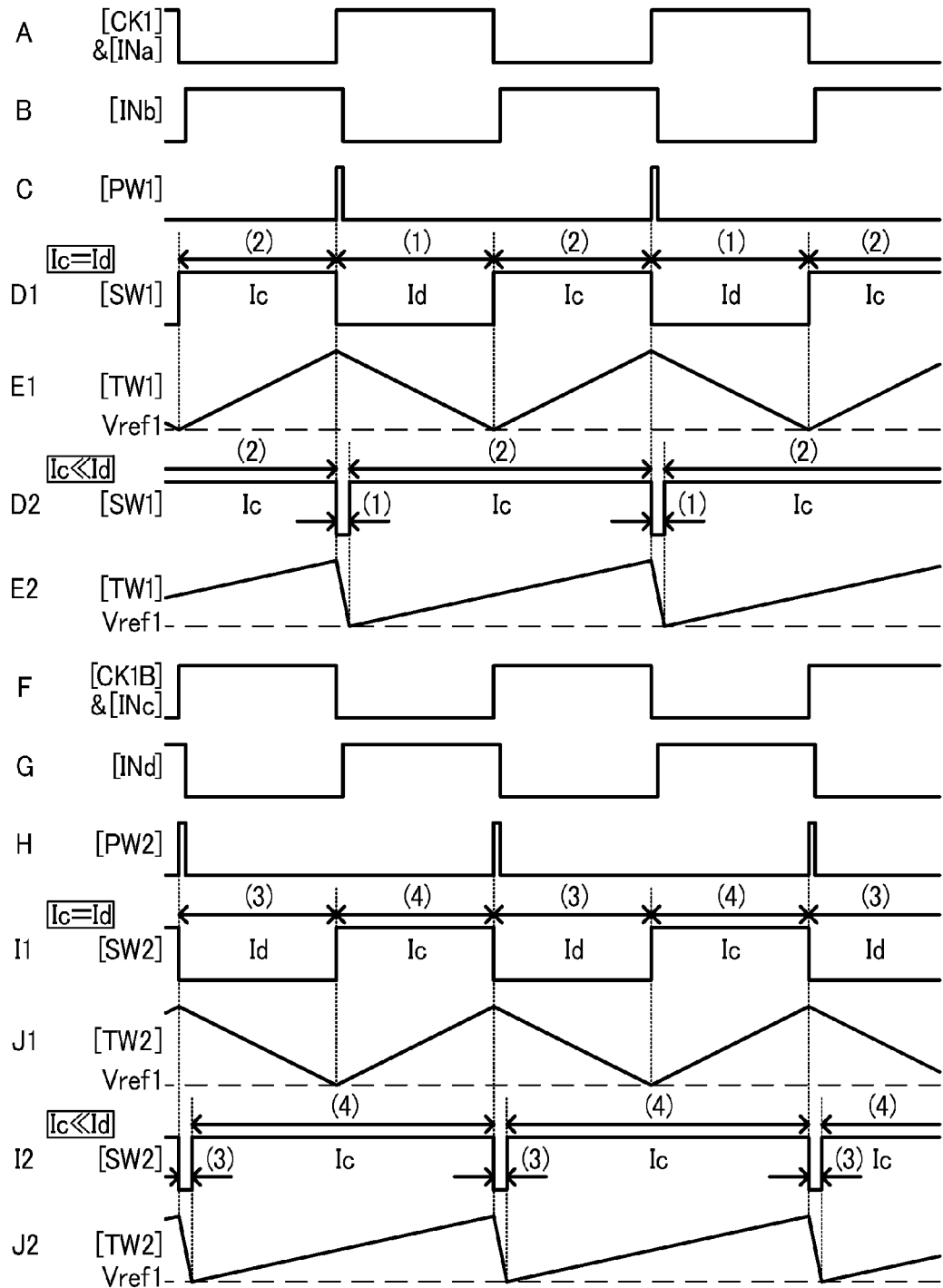
FIG. 2 is an explanatory diagram of (two-output) operation of the triangle wave generating circuit according to a first embodiment of the present invention.

Operation will then be described of the triangle wave generating circuit according to an embodiment of the present invention with reference to FIGS. 1 and 2. In the present specification, a switch circuit is on when a control signal is high and is off when the control signal is low.

The clock signal CK1 illustrated in A of FIG. 2, for example, is input to the pulse generating circuit 5.

The clock signal CK1 is input to the input INa of the AND circuit 512 of the edge detecting circuit 51, and the clock signal CK1 is input to the input INb which is delayed by the delay circuit 510 and further inverted by the inverter 511 as illustrated in B of FIG. 2, for example. Since the AND circuit 512 outputs a signal obtained by logical AND of the input signals, it outputs a signal that goes high only during a period in which both of the input signals to the inputs INa and INb are high, as illustrated in C of FIG. 2, for example. The output signal of the AND circuit 512 serves as a first edge detection signal indicating timing of a rising edge of the clock signal CK1 as a pulse and is input to the charge/discharge circuit 1a as the pulse signal PW1 as described above.

The inverted clock signal CK1B obtained by inverting the clock signal CK1 by the inverter 50 is input to the input INc of the AND circuit 522 of the edge detecting circuit 52 as illustrated in F of FIG. 2, for example, and the inverted clock signal CK1B delayed by the delay circuit 520 and further inverted by the inverter 521 is input to the input INd as illustrated in G of FIG. 2, for example. Since the AND circuit 522 outputs logical AND of the input signals, it outputs a signal that goes high only during a period in which both of the input signals to the inputs INc and INd are high, as illustrated in H of FIG. 2, for example. The output signal of the AND circuit 522 serves as a second edge detection signal indicating timing of a rising edge of the inverted clock signal CK1B, namely, timing of a falling edge of the clock signal CK1, as a pulse and is input to the charge/discharge circuit 2a as the pulse signal PW2 as described above.

As such, the pulse generating circuit 5 supplies as the pulse signal PW1 the first edge detection signal indicating the timing of the rising edge of the clock signal CK1 as the pulse from the edge detecting circuit 51 to the charge/discharge circuit 1a, and supplies as the pulse signal PW2 the second edge detection signal indicating the timing of the falling edge of the clock signal CK1 as the pulse from the edge detecting circuit 52 to the charge/discharge circuit 2a.

When the high-level pulse signal PW1 is input to the R input of the RSFF 10 of the charge/discharge circuit 1a, a non-inverted output signal SW1 of the RSFF 10 goes low, such as in a period (1) of D1 of FIG. 2, for example, so that the switch circuit 12 is turned off and the switch circuit 14 is turned on, and thus, the capacitor 15 is discharged by a (second) current Id flowing into the current source 13. Here, taking capacitance of the capacitor 15 as C and differentiating the voltage Vc across the capacitor 15 with respect to time t give $dVc/dt = -Id/C$ and therefore, when the current Id is constant, the voltage Vc drops at a constant gradient as in a period (1) of E1 of FIG. 2, for example.

Then, when the voltage Vc drops down to the reference voltage Vref1 and the output signal of the comparator 16 input to the S input of the RSFF 10 goes high, the non-inverted output signal SW1 of the RSFF 10 goes high as in a period (2) of D1 of FIG. 2, for example, so that the switch circuit 12 is turned on and the switch circuit 14 is turned off, and thus, the capacitor 15 is charged by a (first) current Ic flowing from the current source 11. Here, differentiating the voltage Vc across the capacitor 15 with respect to time t gives $$dVc/dt=Id/C$$

and therefore, when the current Ic is constant, the voltage Vc rises at a constant gradient as in a period (2) of E1 of FIG. 2, for example.

As such, when supplied with the pulse signal PW1, the charge/discharge circuit 1a turns off the switch circuit 12 and turns on the switch circuit 14 and supplies the current Id from the current source 13, so that the capacitor 15 is discharged at a constant current value, and when the voltage Vc across the capacitor 15 drops to the reference voltage Vref1, the charge/discharge circuit 1a turns on the switch circuit 12 and turns off the switch circuit 14 and supplies the current Ic from the current source 11, so that the capacitor 15 is charged at a constant current value. By repeating such operation, the output voltage of the charge/discharge circuit 1a forms the triangle wave TW1 that starts falling at the rising edge of the clock signal CK1 and switches it to rising when having fallen down to the reference voltage Vref1, as illustrated in E1 of FIG. 2, for example. D1 and E1 of FIG. 2 indicate a case where the currents Ic and Id are equal in current value, and the triangle wave TW1 is a symmetrical triangle wave whose absolute values of gradient are equal in rising and falling. On the other hand, when the current value of the current Id is much greater as compared with that of the current Ic, the triangle wave TW1 forms a saw-tooth wave as illustrated in E2 of FIG. 2, for example.

As described above, since the pulse signal PW2 is input to the R input of the RSFF 20 of the charge/discharge circuit 2a, the output voltage of the charge/discharge circuit 2a forms the triangle wave TW2 that starts falling at the falling edge of the clock signal CK1 and switches it to rising when having fallen down to the reference voltage Vref1, as illustrated in J1 or J2 of FIG. 2, for example.

As such, the charge/discharge circuits 1a and 2a output the triangle waves TW1 and TW2, respectively, with the same period as that of the clock signal CK1 and the phases shifted by a half period of the clock signal CK1, namely, 180° from each other.

Second Embodiment

Here, as a second embodiment of the present invention, the triangle wave generating circuit having a configuration different from that of a first embodiment will be described that outputs two triangle waves with the same period and phases shifted by 180° from each other. A configuration will hereinafter be described of the triangle wave generating circuit according to an embodiment of the present invention with reference to FIG. 3.

Figure 3:
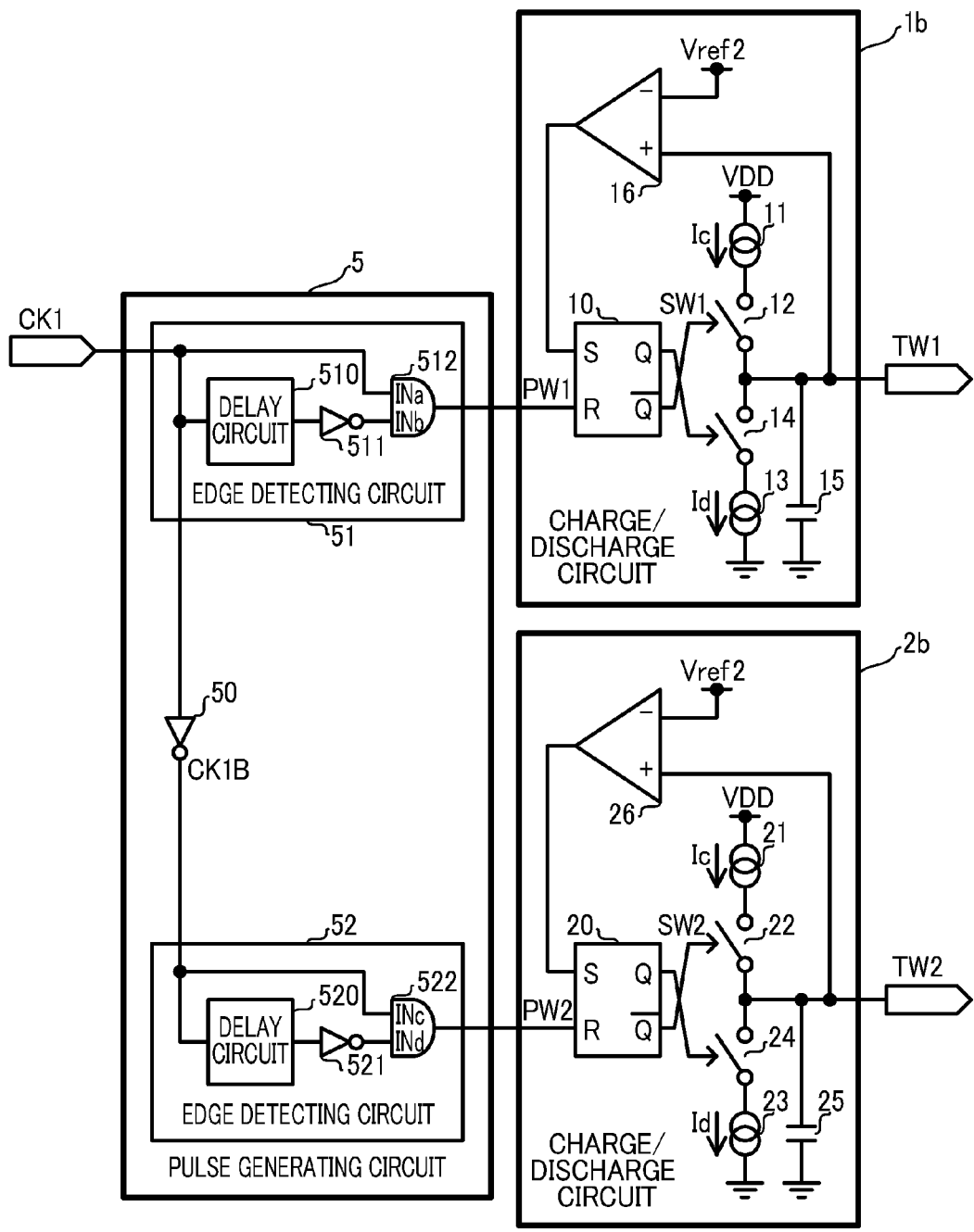
FIG. 3 is a circuit block diagram illustrating a configuration of a triangle wave generating circuit according to a second embodiment of the present invention.

The triangle wave generating circuit illustrated in FIG. 3 includes a pulse generating circuit 5 and charge/discharge circuits 1b and 2b. The pulse generating circuit 5 in an embodiment of the present invention has a configuration similar to that of the pulse generating circuit 5 in a first embodiment.

The charge/discharge circuit 1b includes, for example, an RSFF 10, current sources 11 and 13, switch circuits 12 and 14, a capacitor 15, and a comparator 16 in an embodiment of the present invention. In the RSFF 10, the output signal of the comparator 16 is input to an S input thereof and a pulse signal PW1 is input to an R input thereof and a non-inverted output signal thereof and an inverted output signal thereof serve as the control signals of the switch circuits 14 and 12, respectively. The current source 11 connected to the power source potential VDD, the switch circuit 12, the switch circuit 14, and the current source 13 connected to a ground potential are connected in series in the above order. The comparator 16 has a non-inverted input thereof connected to the connection point of the switch circuits 12 and 14 and an inverted input thereof applied with a reference voltage Vref2 and an output signal thereof is input to the S input of the RSFF 10 as described above. The capacitor 15 has one end thereof connected to the connection point of the switch circuits 12 and 14 and the other end thereof connected to the ground potential, and the voltage across the capacitor is output from the charge/discharge circuit 1b as a triangle wave TW1.

The charge/discharge circuit 2b includes, for example, an RSFF 20, a current sources 21 and 23, switch circuits 22 and 24, a capacitor 25, and a comparator 26 in an embodiment of the present invention. The charge/discharge circuit 2b is connected in the same manner as the charge/discharge circuit 1b is and the pulse signal PW2 is input to the R input of the RSFF 20 and the voltage across the capacitor 25 is output from the charge/discharge circuit 2b as the triangle wave TW2.

Figure 4:
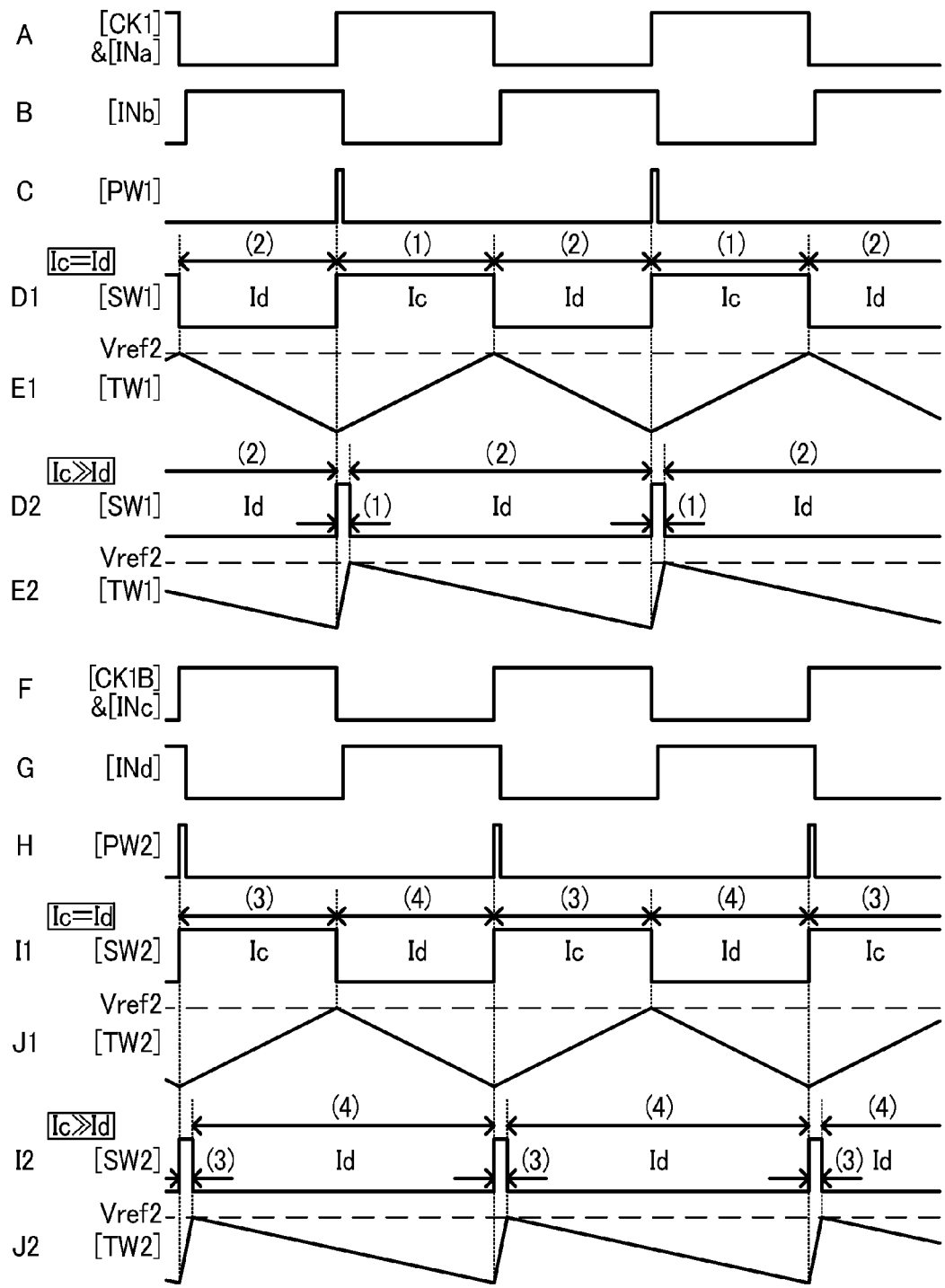
FIG. 4 is an explanatory diagram of (two-output) operation of a triangle wave generating circuit according to a second embodiment of the present invention.

Operation will then be described of the triangle wave generating circuit according to an embodiment of the present invention with reference to FIGS. 3 and 4.

As in the case of a first embodiment of the present invention, in the pulse generating circuit 5, a clock signal CK1 illustrated in A of FIG. 4, for example, is input, the pulse signal PW1 illustrated in C of FIG. 4, for example, is supplied from the (first) edge detecting circuit 51 to the charge/discharge circuit 1b, and the pulse signal PW2 illustrated in H of FIG. 4, for example, is supplied from the (second) edge detecting circuit 52 to the charge/discharge circuit 2b.

When the high-level pulse signal PW1 is input to the R input of the RSFF 10 of the charge/discharge circuit 1b, an inverted output signal SW1 of the RSFF 10 goes high such as in a period (1) of D1 of FIG. 4, for example, so that the switch circuit 12 is turned on and the switch circuit 14 is turned off, and thus, the capacitor 15 is charged by a (first) current Ic flowing from the current source 11. Here, taking capacitance of the capacitor 15 as C and differentiating the voltage Vc across the capacitor 15 with respect to time t give $$dVc/dt=Ic/C$$

and therefore, when the current Ic is constant, the voltage Vc rises at a constant gradient as in a period (1) of E1 of FIG. 4, for example.

Then, when the voltage Vc rises up to the reference voltage Vref2 and the output signal of the comparator 16 input to the S input of the RSFF 10 goes high, the inverted output signal SW1 of the RSFF 10 goes low as in a period (2) of D1 of FIG. 4, for example, so that the switch circuit 12 is turned off and the switch circuit 14 is turned on, and thus, the capacitor 15 is discharged by a (second) current Id flowing into the current source 13. Here, differentiating the voltage Vc across the capacitor 15 with respect to time t gives $$dVc/dt=-Id/C$$

and therefore, when the current Id is constant, the voltage Vc falls at a constant gradient as in a period (2) of E1 of FIG. 4, for example.

As such, when supplied with the pulse signal PW1, the charge/discharge circuit 1b turns on the switch circuit 12 and turns off the switch circuit 14 and supplies the current Ic from the current source 11, so that the capacitor 15 is charged at a constant current value, and when the voltage Vc across the capacitor 15 rises up to the reference voltage Vref2, the charge/discharge circuit 1b turns off the switch circuit 12 and turns on the switch circuit 14 and supplies the current Id from the current source 13, so that the capacitor 15 is discharged at a constant current value. By repeating such operation, the output voltage of the charge/discharge circuit lb forms the triangle wave TW1 that starts rising at a rising edge of the clock signal CK1 and switches it to falling when having risen up to the reference voltage Vref2, as illustrated in E1 of FIG. 4, for example. D1 and E1 of FIG. 4 indicate a case where the currents Ic and Id are equal in current value, and the triangle wave TW1 is a symmetrical triangle wave whose absolute values of gradient are equal in rising and falling. On the other hand, when the current value of the current Ic is much greater as compared with that of the current Id, the triangle wave TW1 forms a saw-tooth wave (inverted saw-tooth wave) obtained by inverting the saw-tooth wave illustrated in E2 of FIG. 2, as illustrated in E2 of FIG. 4, for example.

As described above, since the pulse signal PW2 is input to the R input of the RSFF 20 of the charge/discharge circuit 2b, the output voltage of the charge/discharge circuit 2b forms the triangle wave TW2 that starts rising at a falling edge of the clock signal CK1 and switches it to falling when having risen up to the reference voltage Vref2, as illustrated in J1 or J2 of FIG. 4, for example.

As such, the charge/discharge circuits 1b and 2b output the triangle waves TW1 and TW2, respectively, with the same period as that of the clock signal CK1 and the phases shifted by a half period of the clock signal CK1, namely, 180° from each other.

Third Embodiment

Here, as a third embodiment of the present invention, the triangle wave generating circuit will now be described that outputs three triangle waves with the same period and phases shifted by 120° from one another. A configuration will hereinafter be described of the triangle wave generating circuit according to an embodiment of the present invention with reference to FIG. 5.

Figure 5:
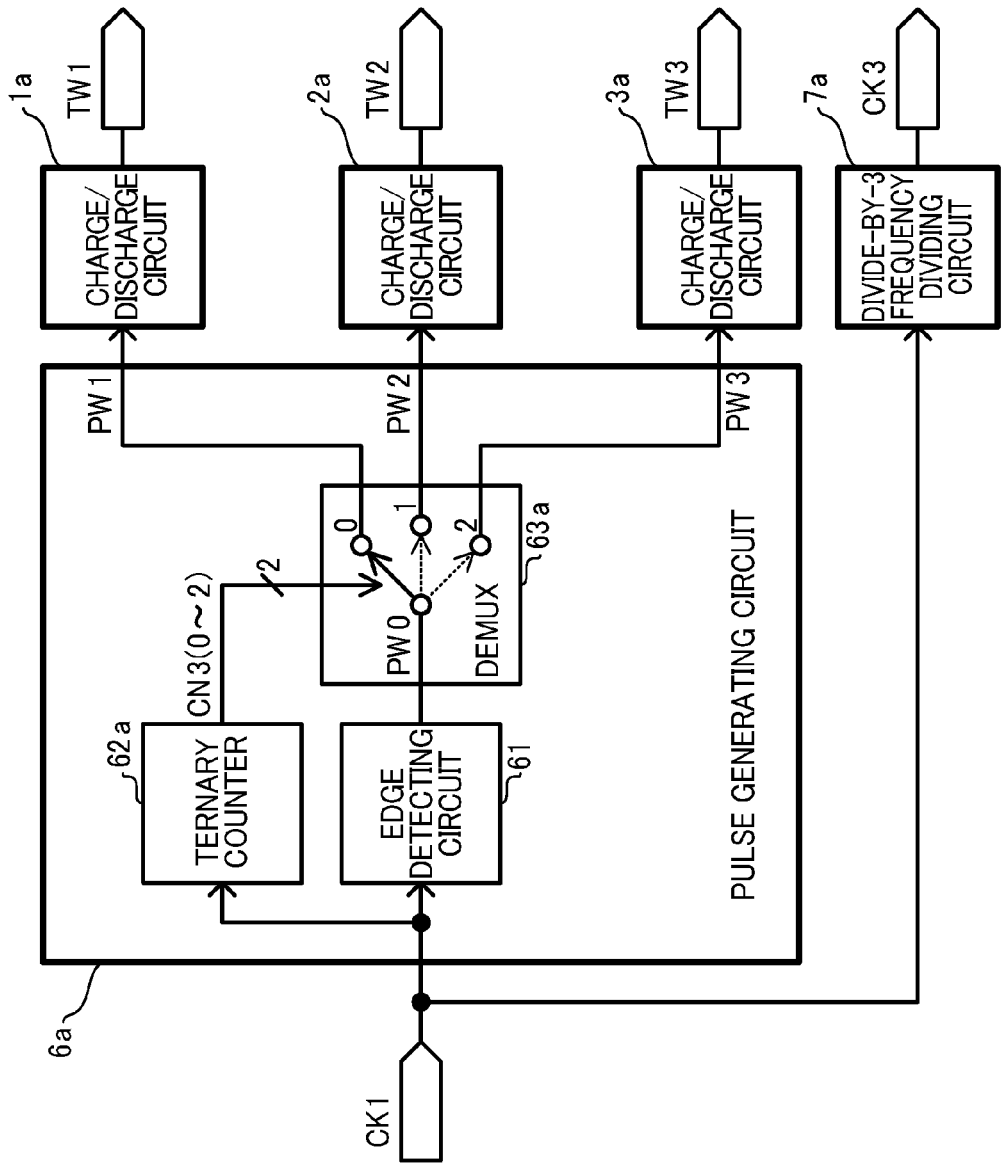
FIG. 5 is a block diagram illustrating a configuration of a triangle wave generating circuit according to a third embodiment of the present invention.

The triangle wave generating circuit illustrated in FIG. 5 includes a pulse generating circuit 6a, charge/discharge circuits 1a, 2a, and 3a, and a frequency dividing circuit 7a. In the charge/discharge circuits 1a, 2a, and 3a according to an embodiment of the present invention, configurations thereof are similar to those of the charge/discharge circuits 1a and 2a in a first embodiment according to the present invention, pulse signals PW1, PW2, and PW3 are input thereto, respectively, and triangle waves TW1, TW2, and TW3 are output therefrom, respectively.

The pulse generating circuit 6a includes, for example, an edge detecting circuit 61 having the same configuration as that of the edge detecting circuit 51 of the pulse generating circuit 5, a counter 62a which is a ternary counter, and a DEMUX (demultiplexer) 63a with three outputs in an embodiment of the present invention. A (first) clock signal CK1 is input to the edge detecting circuit 61 and the output signal of the edge detecting circuit 61 is input to a data input of the DEMUX 63a as an edge detection signal PW0. The clock signal CK1 is input to the counter 62a as well and a count value CN3 of the counter 62a is input to a selection control input of the DEMUX 63a. Three output signals corresponding to values of the selection control input of the DEMUX 63a are input to the charge/discharge circuit 1a as the pulse signal PW1, to the charge/discharge circuit 2a as the pulse signal PW2, and to the charge/discharge circuit 3a as the pulse signal PW3, respectively.

The clock signal CK1 is input to the frequency dividing circuit 7a which is a divide-by-3 frequency dividing circuit and a clock signal CK3 is output therefrom.

Figure 6:
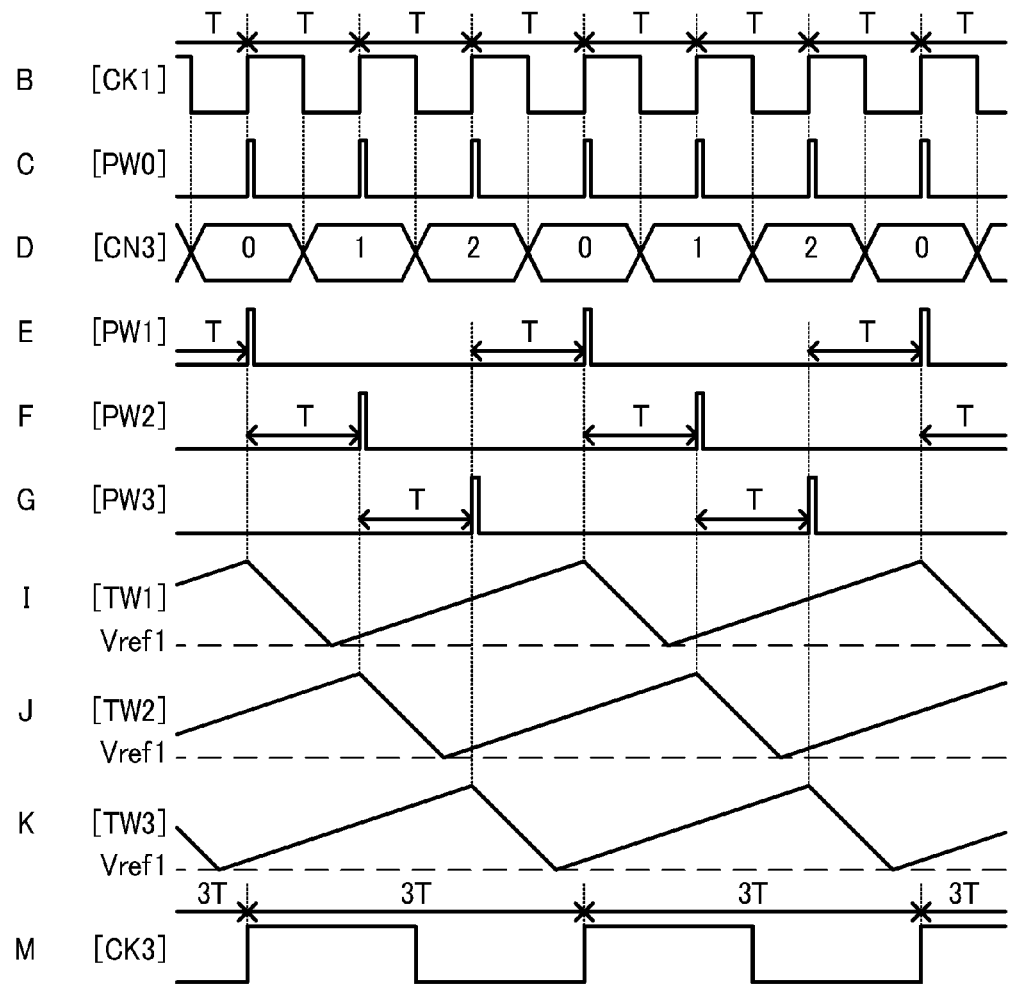
FIG. 6 is an explanatory diagram of (three-output) operation of a triangle wave generating circuit according to a third embodiment of the present invention.

Operation will then be described of the triangle wave generating circuit according to an embodiment of the present invention with reference to FIGS. 5 and 6.

The clock signal CK1 with a period T illustrated in B of FIG. 6, for example, is input to the edge detecting circuit 61 and the counter 62a of the pulse generating circuit 6a. The edge detecting circuit 61 outputs the edge detection signal PW0 indicating timing of a rising edge of the clock signal CK1 as a pulse as illustrated in C of FIG. 6, for example. The counter 62a counts up at a falling edge of the clock signal CK1 and repeats a change from 0 to 2 in the count value CN3 as illustrated in D of FIG. 6, for example. The DEMUX 63a sequentially selects any one of the charge/discharge circuits 1a to 3a according to the count value CN3 input to the selection control input, and outputs the edge detection signal PW0 to the above selected one of the charge/discharge circuits as the pulse signal PW1, PW2, or PW3.

More specifically, in the pulse generating circuit 6a, each output of the DEMUX 63a is pulled down by a resistor (not shown), for example, the pulse signal PW1, which contains only the pulse when the count value CN3 is 0 out of the pulses of the edge detection signal PW0, is output to the charge/discharge circuit 1a, the pulse signal PW2, which contains only the pulse when the count value CN3 is 1, is output to the charge/discharge circuit 2a, and the pulse signal PW3, which contains only the pulse when the count value CN3 is 2, is output to the charge/discharge circuit 3a. Therefore, the pulses contained in the pulse signals PW1 to PW3 are shifted in timing by the period T of the clock signal CK1 from one another as illustrated in E to G of FIG. 6, for example.

The charge/discharge circuits 1a to 3a output the triangle waves TW1 to TW3, respectively, that start falling at the timing of the pulses of the pulse signals PW1 to PW3, respectively, and switch it to rising when having fallen down to the reference voltage Vref1, as illustrated in I to K of FIG. 6, for example. Therefore, the triangle waves TW1 to TW3 have a period 3T, which is three times the period of the clock signal CK1, and have waveforms shifted by the period T of the clock signal CK1 from one another.

The frequency dividing circuit 7a frequency divides the clock signal CK1 by three and outputs the clock signal CK3 with the period 3T illustrated in M of FIG. 6, for example.

As such, the charge/discharge circuits 1a to 3a output the triangle waves TW1 to TW3, respectively, with the period 3T, which is the same period as that of the clock signal CK3, and the phases shifted by the period T, which is one third of the period of the clock signal CK3, namely, 120° from one another.

Fourth Embodiment

Here, as a fourth embodiment of the present invention, the triangle wave generating circuit will now be described that outputs four triangle waves with the same period and phases shifted by 90° from one another. A configuration will hereinafter be described of the triangle wave generating circuit according to an embodiment of the present invention with reference to FIG. 7.

Figure 7:
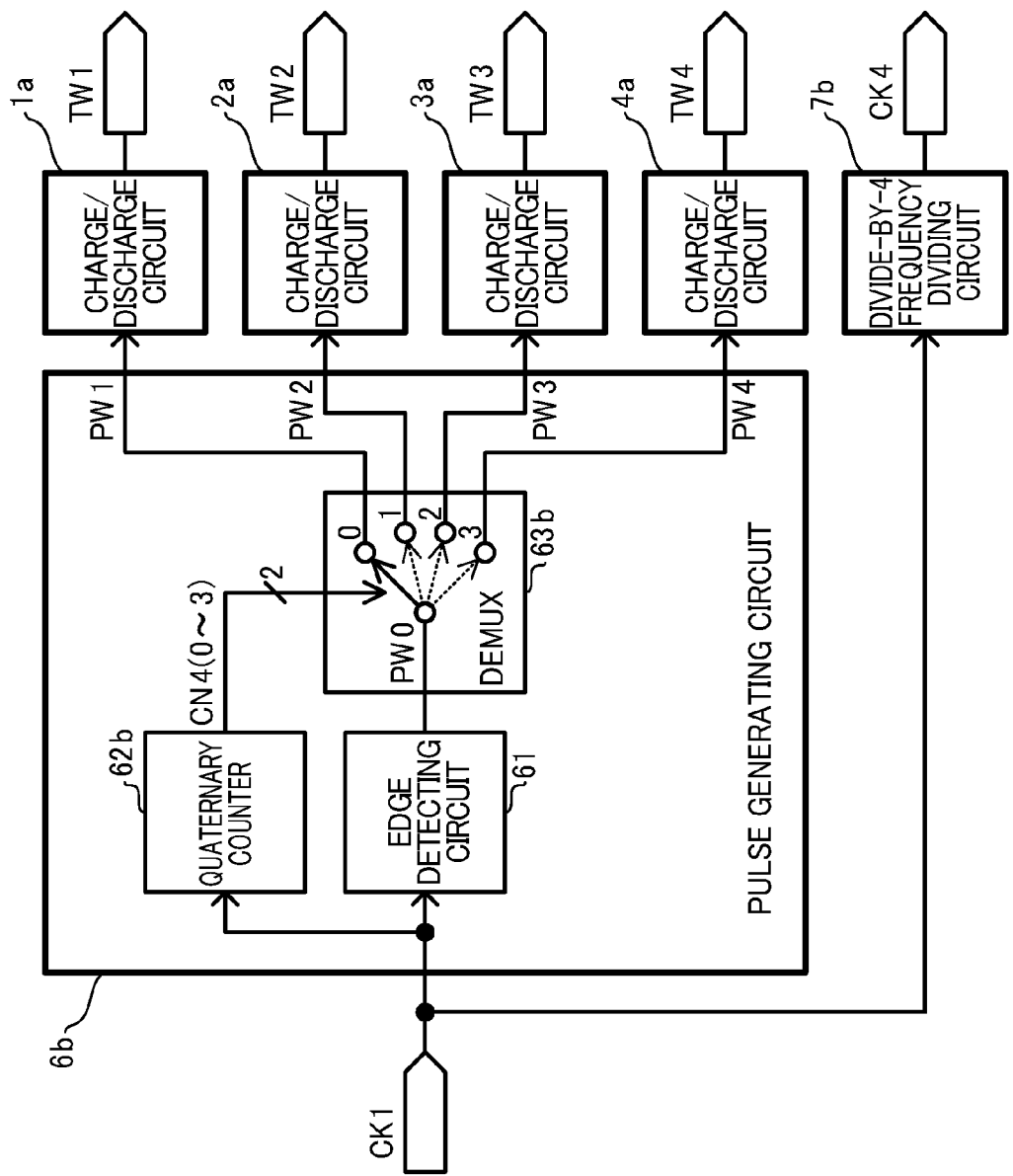
FIG. 7 is a block diagram of a configuration of a triangle wave generating circuit according to a fourth embodiment of the present invention.

The triangle wave generating circuit illustrated in FIG. 7 includes a pulse generating circuit 6b, charge/discharge circuits 1a, 2a, 3a, and 4a, and a frequency dividing circuit 7b. In the charge/discharge circuits 1a, 2a, 3a, and 4a according to an embodiment of the present invention, configurations thereof are similar to those of the charge/discharge circuits 1a and 2a in a first embodiment of the present invention, pulse signals PW1, PW2, PW3, and PW4 are input thereto, respectively, and triangle waves TW1, TW2, TW3, and TW4 are output therefrom, respectively.

The pulse generating circuit 6b includes, for example, an edge detecting circuit 61 having the same configuration as that of the edge detecting circuit 51 of the pulse generating circuit 5, a counter 62b which is a quaternary counter, and a DEMUX 63b with four outputs in an embodiment of the present invention. A (first) clock signal CK1 is input to the edge detecting circuit 61 and the output signal of the edge detecting circuit 61 is input to a data input of the DEMUX 63b as an edge detection signal PW0. The clock signal CK1 is input to the counter 62b as well and a count value CN4 of the counter 62b is input to a selection control input of the DEMUX 63b. Four output signals corresponding to values of the selection control input of the DEMUX 63b are input to the charge/discharge circuit 1a as the pulse signal PW1, to the charge/discharge circuit 2a as the pulse signal PW2, to the charge/discharge circuit 3a as the pulse signal PW3, and to the charge/discharge circuit 4a as the pulse signal PW4, respectively.

The clock signal CK1 is input to the frequency dividing circuit 7b which is a divide-by-4 frequency dividing circuit and a clock signal CK4 is output therefrom.

Figure 8:
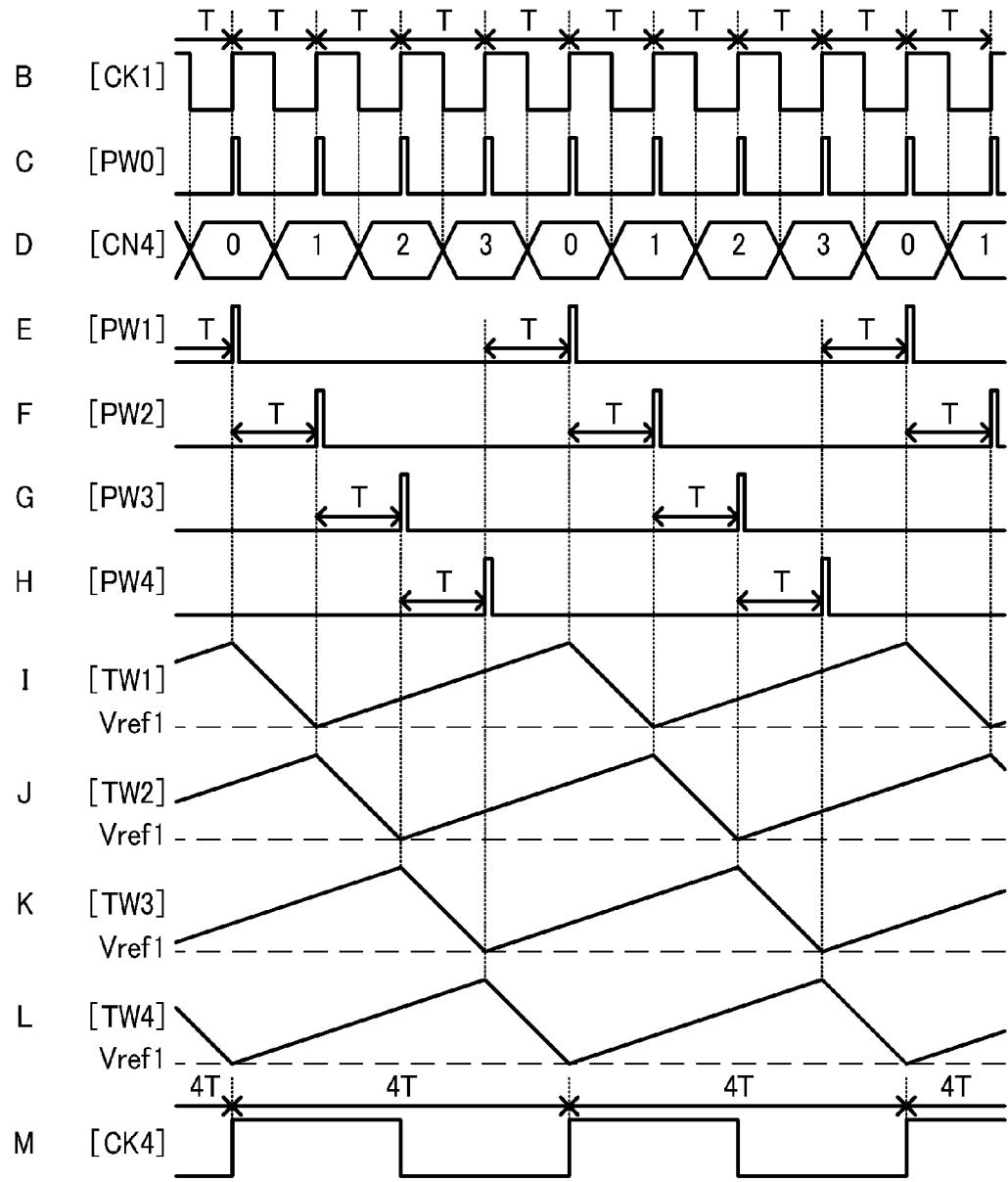
FIG. 8 is an explanatory diagram of (four-output) operation of a triangle wave generating circuit according to a fourth embodiment of the present invention.

Operation will then be described of the triangle wave generating circuit according to an embodiment of the present invention with reference to FIGS. 7 and 8.

The clock signal CK1 with a period T illustrated in B of FIG. 8, for example, is input to the edge detecting circuit 61 and the counter 62b of the pulse generating circuit 6b. The edge detecting circuit 61 outputs the edge detection signal PW0 indicating timing of a rising edge of the clock signal CK1 as a pulse, as illustrated in C of FIG. 8, for example. The counter 62b counts up at a falling edge of the clock signal CK1 and repeats a change from 0 to 3 in the count value CN4 as illustrated in D of FIG. 8, for example. The DEMUX 63b sequentially selects any one of the charge/discharge circuits 1a to 4a according to the count value CN4 input to the selection control input, and outputs the edge detection signal PW0 to the above selected one of the charge/discharge circuits as the pulse signal PW1, PW2, PW3, or PW4.

More specifically, in the pulse generating circuit 6b, each output of the DEMUX 63b is pulled down by a resistor (not shown), for example, the pulse signal PW1, which contains only the pulse when the count value CN4 is 0 out of the pulses of the edge detection signal PW0, is output to the charge/discharge circuit 1a, the pulse signal PW2, which contains only the pulse when the count value CN4 is 1, is output to the charge/discharge circuit 2a, the pulse signal PW3, which contains only the pulse when the count value CN4 is 2 is output to the charge/discharge circuit 3a, and the pulse signal PW4, which contains only the pulse when the count value CN4 is 3 to is output the charge/discharge circuit 4a. Therefore, the pulses contained in the pulse signals PW1 to PW4 are shifted in timing by the period T of the clock signal CK1 from one another as illustrated in E to H of FIG. 8, for example.

The charge/discharge circuits 1a to 4a output the triangle waves TW1 to TW4, respectively, that start falling at the timing of the pulses of the pulse signals PW1 to PW4, respectively, and switch it to rising when having fallen down to the reference voltage Vref1, as illustrated in I to L of FIG. 8, for example. Therefore, the triangle waves TW1 to TW4 have a period 4T, which is four times the period of the clock signal CK1, and have waveforms shifted by the period T of the clock signal CK1 from one another.

The frequency dividing circuit 7b frequency divides the clock signal CK1 by four and outputs the clock signal CK4 with the period 4T illustrated in M of FIG. 8, for example.

As such, the charge/discharge circuits 1a to 4a output the triangle waves TW1 to TW4, respectively, with the period 4T, which is the same period as that of the clock signal CK4, and the phases shifted by the period T, which is one fourth of the period of the clock signal CK4, namely, 90° from one another.

Fifth Embodiment

Here, as a fifth embodiment of the present invention, the triangle wave generating circuit will now be described that is capable of selecting two-output operation of outputting two triangle waves with the same period and phases shifted by 180° from each other, three-output operation of outputting three triangle waves with the same period and phases shifted by 120° from one another, or four-output operation of outputting four triangle waves with the same period and phases shifted by 90° from one another. A configuration will hereinafter be described of the triangle wave generating circuit according to an embodiment of the present invention with reference to FIG. 9.

Figure 9:
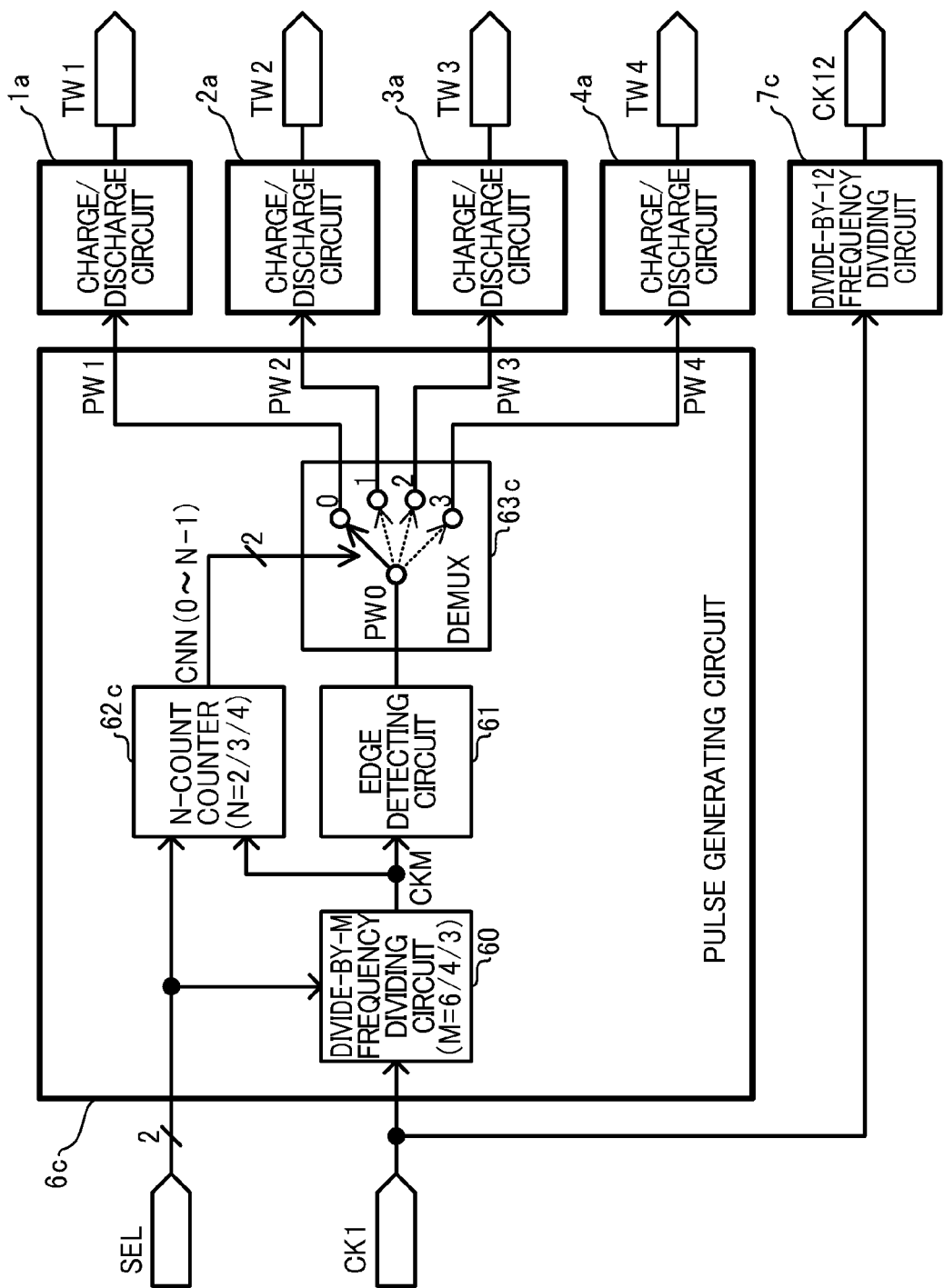
FIG. 9 is a block diagram of a configuration of a triangle wave generating circuit according to a fifth embodiment of the present invention.

The triangle wave generating circuit illustrated in FIG. 9 includes a pulse generating circuit 6c, charge/discharge circuits 1a, 2a, 3a, and 4a, and a frequency dividing circuit 7c. In the charge/discharge circuits 1a, 2a, 3a, and 4a in an embodiment of the present invention, configurations thereof are similar to those of the charge/discharge circuits 1a and 2a in a first embodiment of the present invention, pulse signals PW1, PW2, PW3, and PW4 are input thereto, respectively, and triangle waves TW1, TW2, TW3, and TW4 are output therefrom, respectively.

The pulse generating circuit 6c includes, for example, a frequency dividing circuit 60 capable of setting a frequency division ratio, an edge detecting circuit 61 having the same configuration as that of the edge detecting circuit 51 of the pulse generating circuit 5, a counter 62c capable of setting a count number, and a DEMUX 63c with four outputs in an embodiment of the present invention. A (second) clock signal CK1 is input to the frequency dividing circuit 60 and a (first) clock signal CKM is output therefrom. The clock signal CKM is input to the edge detecting circuit 61 and the output signal of the edge detecting circuit 61 is input to a data input of the DEMUX 63c as an edge detection signal PW0. The clock signal CKM is input to the counter 62c as well and a count value CNN of the counter 62c is input to a selection control input of the DEMUX 63c. Four output signals corresponding to values of the selection control input of the DEMUX 63c are input to the charge/discharge circuit 1a as the pulse signal PW1, to the charge/discharge circuit 2a as the pulse signal PW2, to the charge/discharge circuit 3a as the pulse signal PW3, and to the charge/discharge circuit 4a as the pulse signal PW4, respectively. A frequency division ratio M of the frequency dividing circuit 60 and a count number N of the counter 62c are set according to a selection signal SEL. The clock signal CK1 is input to the frequency dividing circuit 7c which is a divide-by-12 frequency dividing circuit and a clock signal CK12 is output therefrom.

Operation will then be described of the triangle wave generating circuit according to an embodiment of the present invention with reference to FIGS. 9 to 12. In an embodiment of the present invention, it is assumed that the count number N of the counter 62c is set at any of such values as 2, 3, and 4 according to the selection signal SEL, as an example. In this case, the frequency division ratio M of the frequency dividing circuit 60 is set according to the selection signal SEL at a value obtained by dividing 12, which is the lowest common multiple of values capable of being set as the count number N, by the count number N, that is, at M=6 for N=2, at M=4 for N=3, and at M=3 for N=4. The frequency division ratio of the frequency dividing circuit 7c is 12, which is the lowest common multiple of the values capable of being set as the count number N and the frequency dividing circuit 7c frequency divides the clock signal CK1 by 12 and outputs the clock signal CK12 with a period 12T illustrated in M of FIG. 10, for example.

Operation in the case of N=2 and M=6 will now be described with reference to FIGS. 9 and 10.

Figure 10:
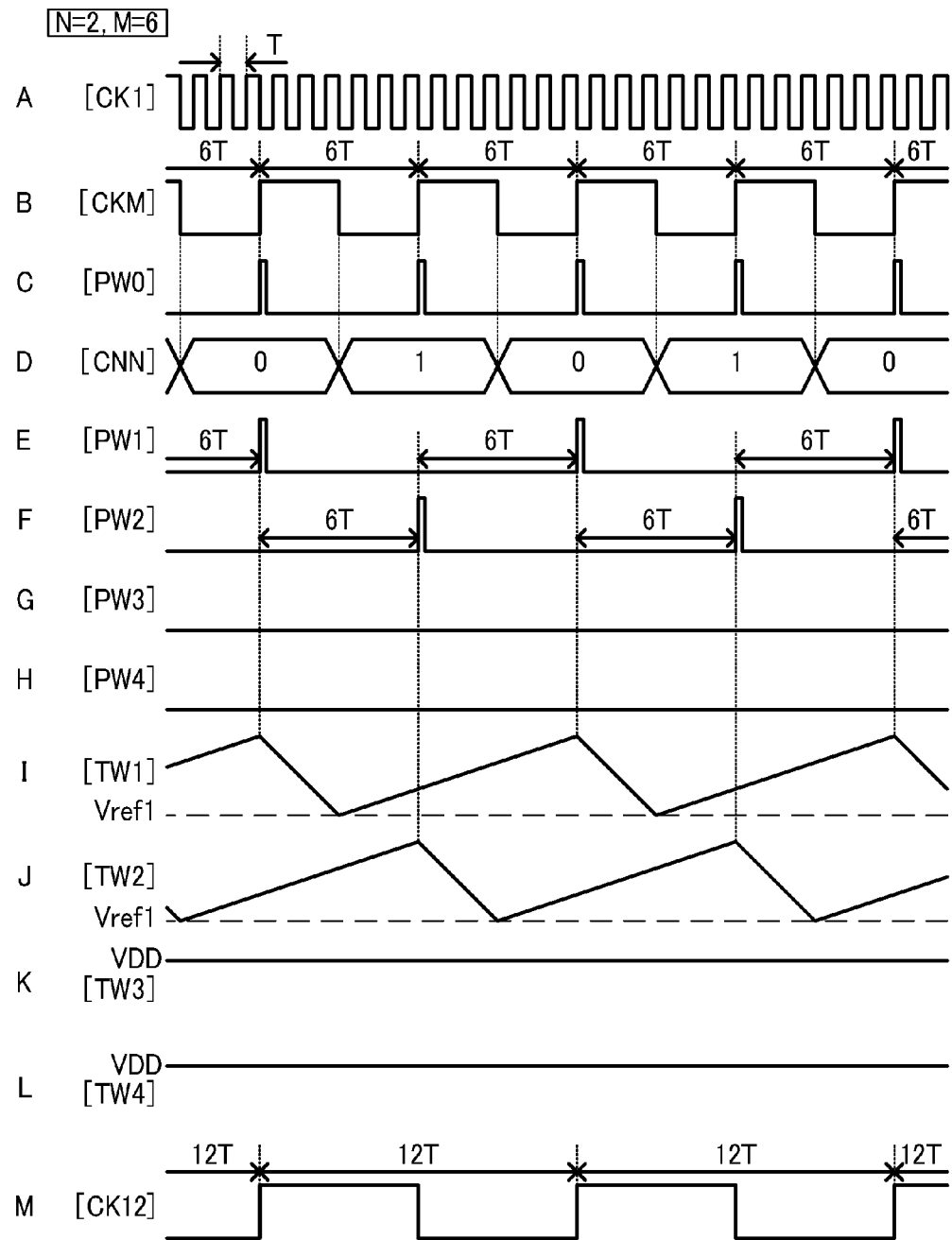
FIG. 10 is an explanatory diagram of two-output operation of a triangle wave generating circuit according to a fifth embodiment of the present invention.

The frequency dividing circuit 60 of the pulse generating circuit 6c frequency divides by six the clock signal CK1 with a period T illustrated in A of FIG. 10, for example, and outputs the clock signal CKM with a period 6T illustrated in B of FIG. 10, for example, to the edge detecting circuit 61 and the counter 62c. The edge detecting circuit 61 outputs the edge detection signal PW0 indicating timing of a rising edge of the clock signal CKM as a pulse, as illustrated in C of FIG. 10, for example. The counter 62c counts up at a falling edge of the clock signal CKM and repeats a change from 0 to 1 in the count value CNN as illustrated in D of FIG. 10, for example. The DEMUX 63c alternately selects the charge/discharge circuit 1a or 2a according to the count value CNN input to the selection control input and outputs the edge detection signal PW0 to the above selected charge/discharge circuit as the pulse signal PW1 or PW2. More specifically, in the pulse generating circuit 6c, each output of the DEMUX 63c is pulled down by a resistor (not shown), for example, the pulse signal PW1, which contains only the pulse when the count value CNN is 0 out of the pulses of the edge detection signal PW0, is output to the charge/discharge circuit 1a, and the pulse signal PW2, which contains only the pulse when the count value CNN is 1, is output to the charge/discharge circuit 2a. Therefore, the pulses contained in the pulse signals PW1 and PW2 are shifted in timing by the period 6T of the clock signal CKM from each other as illustrated in E and F of FIG. 10, for example. Both of the pulse signals PW3 and PW4 are fixed at a low level as illustrated in G and H of FIG. 10, for example.

The charge/discharge circuits 1a and 2a output the triangle waves TW1 and TW2, respectively, that start falling at the timing of the pulses of the pulse signals PW1 and PW2, respectively, and switch it to rising when having fallen down to the reference voltage Vref1, as illustrated in I and J of FIG. 10, for example. Therefore, the triangle waves TW1 and TW2 have a period 12T, which is twice the period of the clock signal CKM, and have waveforms shifted by the period 6T of the clock signal CKM from each other. Since the pulse signals PW3 and PW4 do not contain any pulse for causing the charge/discharge circuit to start discharging of the capacitor, both of the output voltages of the charge/discharge circuits 3a and 4a are in a steady state where the voltages are charged to the source voltage VDD as illustrated in K and L of FIG. 10, for example.

As such, in the case of N=2 and M=6, the charge/discharge circuits 1a and 2a output the triangle waves TW1 and TW2, respectively, with the period 12T, which is the same period as that of the clock signal CK12, and the phases shifted by the period 6T, which is a half of the period of the clock signal CK12, namely, 180° from each other.

Operation in the case of N=3 and M=4 will then be described with reference to FIGS. 9 and 11.

Figure 11:
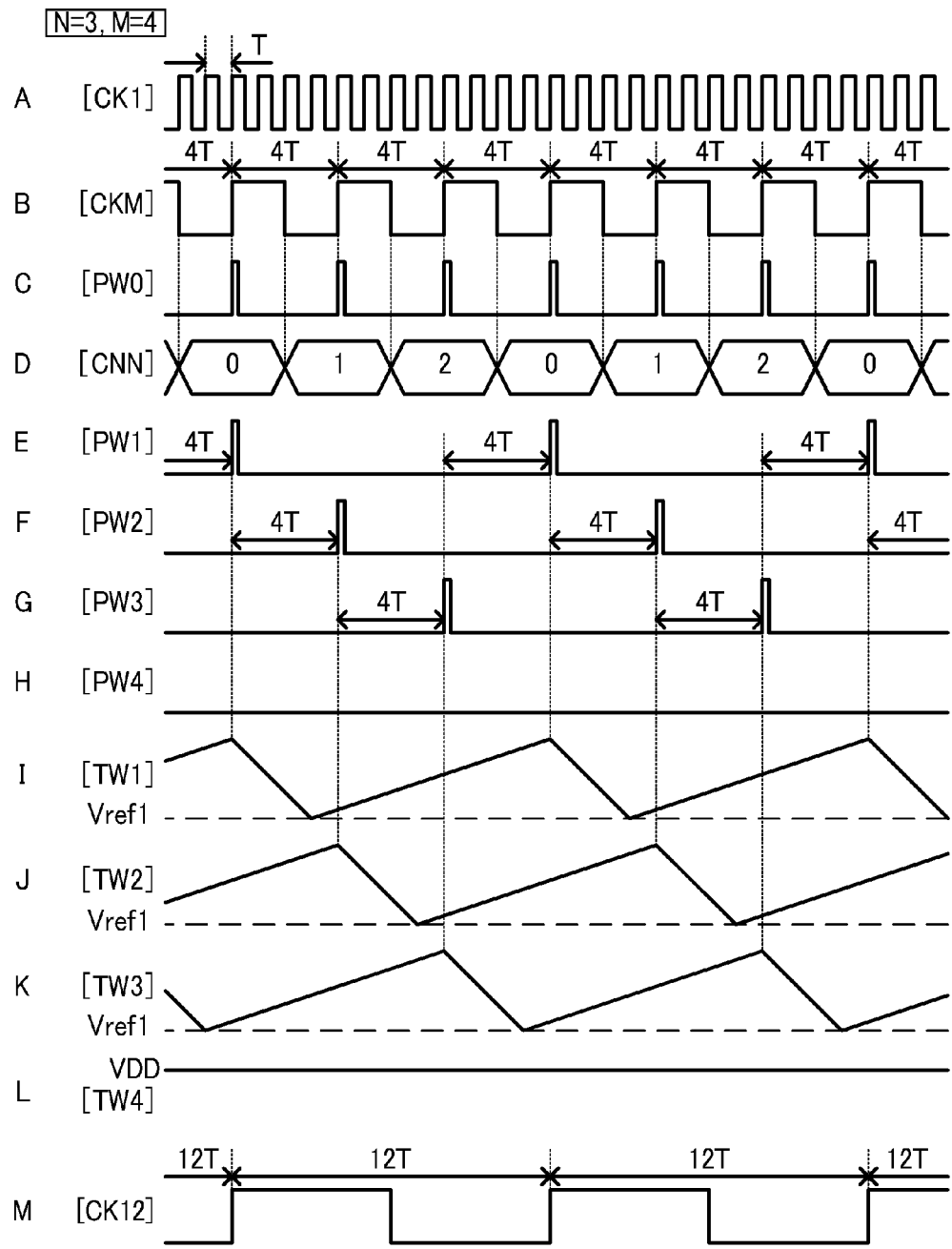
FIG. 11 is an explanatory diagram of three-output operation of a triangle wave generating circuit according to a fifth embodiment of the present invention.

The frequency dividing circuit 60 of the pulse generating circuit 6c frequency divides by four a clock signal CK1 with a period T illustrated in A of FIG. 11, for example, and outputs the clock signal CKM with a period 4T illustrated in B of FIG. 11, for example, to the edge detecting circuit 61 and the counter 62c. In this case, operation of the edge detecting circuit 61, the counter 62c, and the DEMUX 63c is similar to the operation in a case where the clock signal CKM is input in place of the clock signal CK1 in the pulse generating circuit 6a of a third embodiment of the present invention and the pulses contained in the pulse signals PW1 to PW3 output from the pulse generating circuit 6c are shifted in timing by the period 4T of the clock signal CKM from one another as illustrated in E to G of FIG. 11, for example. The pulse signal PW4 is fixed at the low level as illustrated in G of FIG. 11, for example.

The charge/discharge circuits 1a to 3a output the triangle waves TW1 to TW3, respectively, that start falling at the timing of the pulses of the pulse signals PW1 to PW3, respectively, and switch it to rising when having fallen down to the reference voltage Vref1, as illustrated in I to K of FIG. 11, for example. Therefore, the triangle waves TW1 to TW3 have a period 12T, which is three times the period of the clock signal CKM, and have waveforms shifted by the period 4T of the clock signal CKM from one another. Since the pulse signal PW4 does not contain any pulse for causing the charge/discharge circuit to start discharging of the capacitor, the output voltage of the charge/discharge circuit 4a is in the steady state where the voltage is charged to the source voltage VDD as illustrated in L of FIG. 11, for example.

As such, in the case of N=3 and M=4, the charge/discharge circuits 1a to 3a output the triangle waves TW1 to TW3, respectively, with the period 12T, which is the same period as that of the clock signal CK12, and the phases shifted by the period 4T, which is one third of the period of the clock signal CK12, namely, 120° from one another.

Operation in the case of N=4 and M=3 will then be described with reference to FIGS. 9 and 12.

Figure 12:
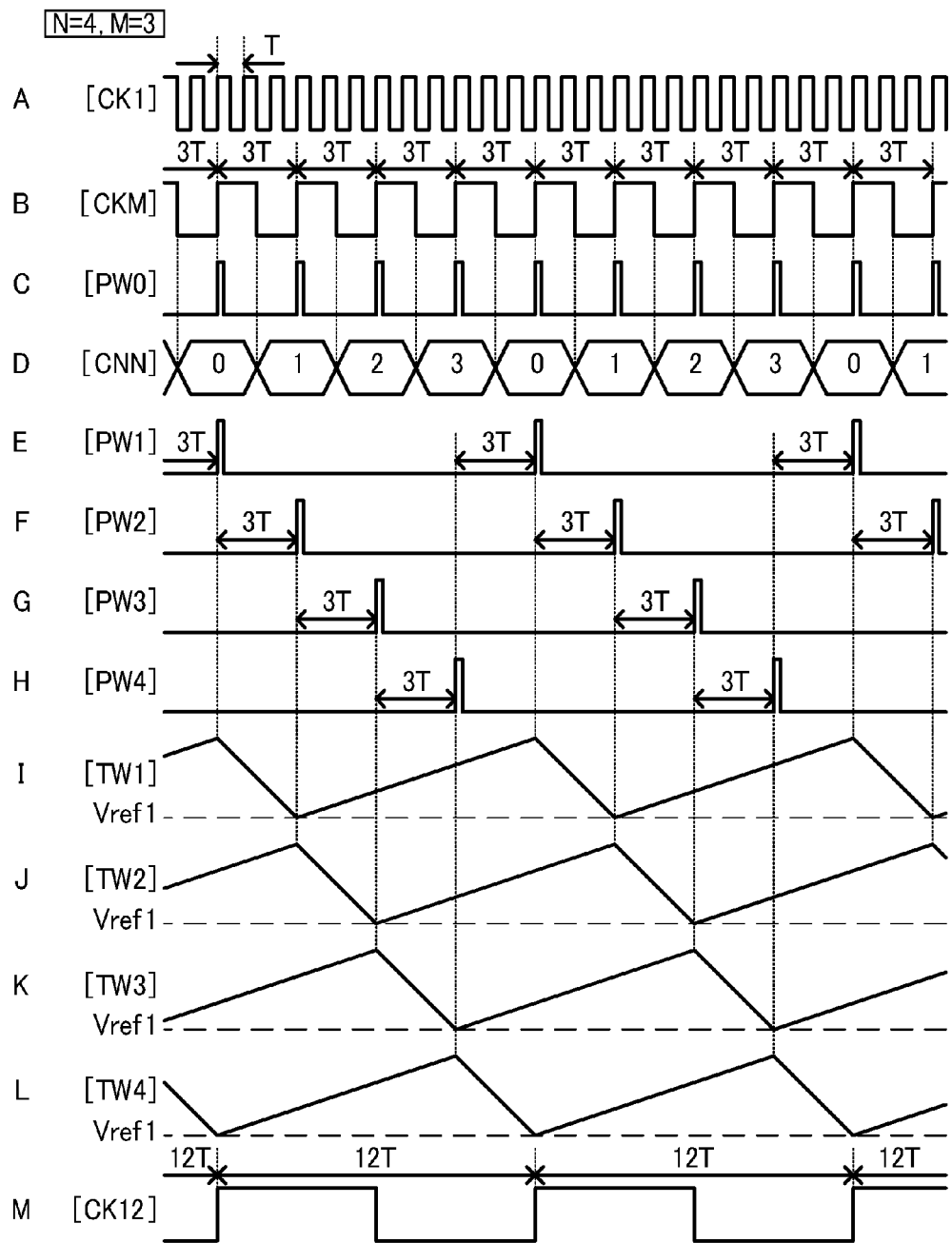
FIG. 12 is an explanatory diagram of four-output operation of a triangle wave generating circuit according to a fifth embodiment of the present invention.
Figure 13:
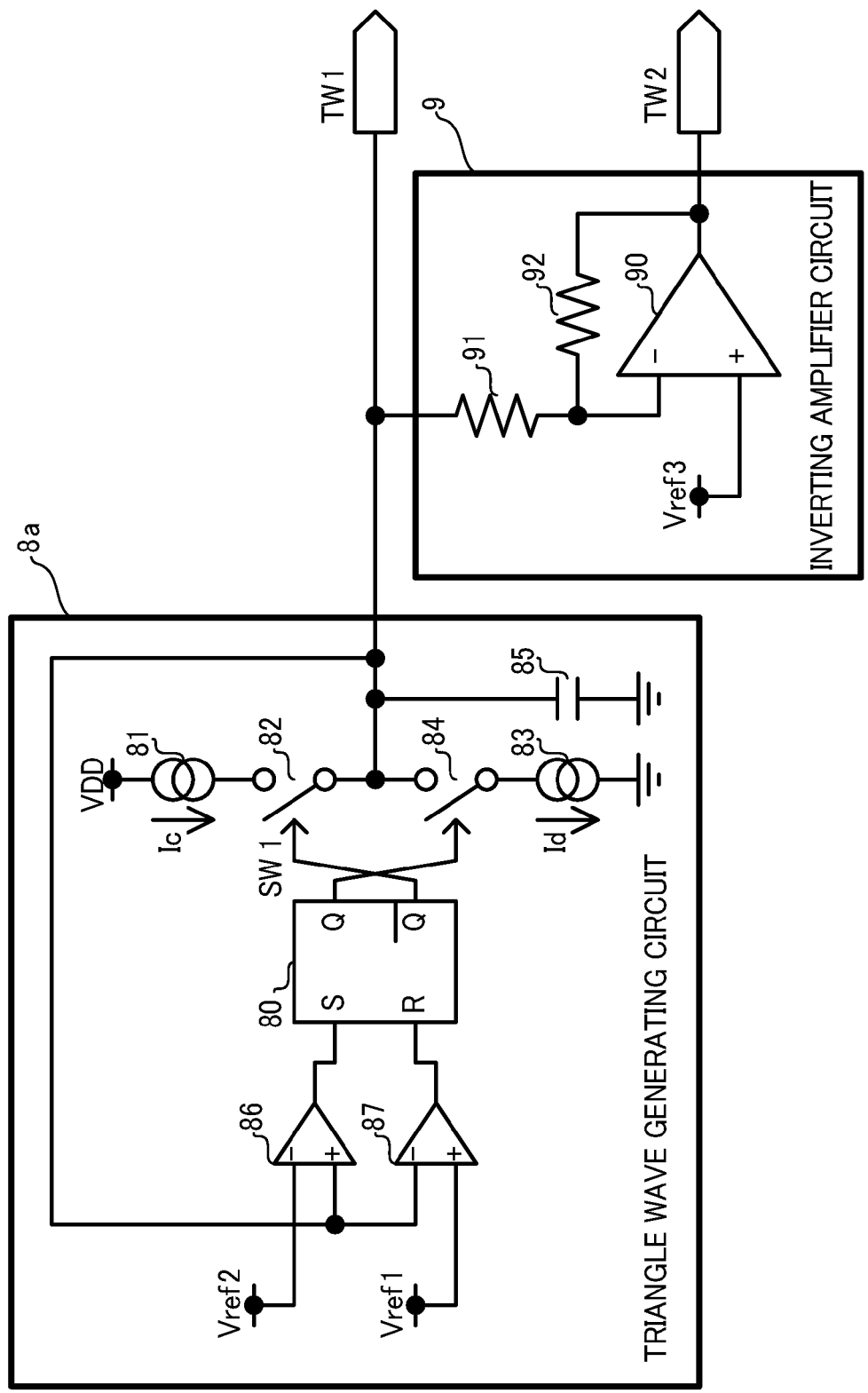
FIG. 13 is a circuit block diagram of one configuration example of a common circuit that outputs two triangle waves with phases different from each other.
Figure 14:
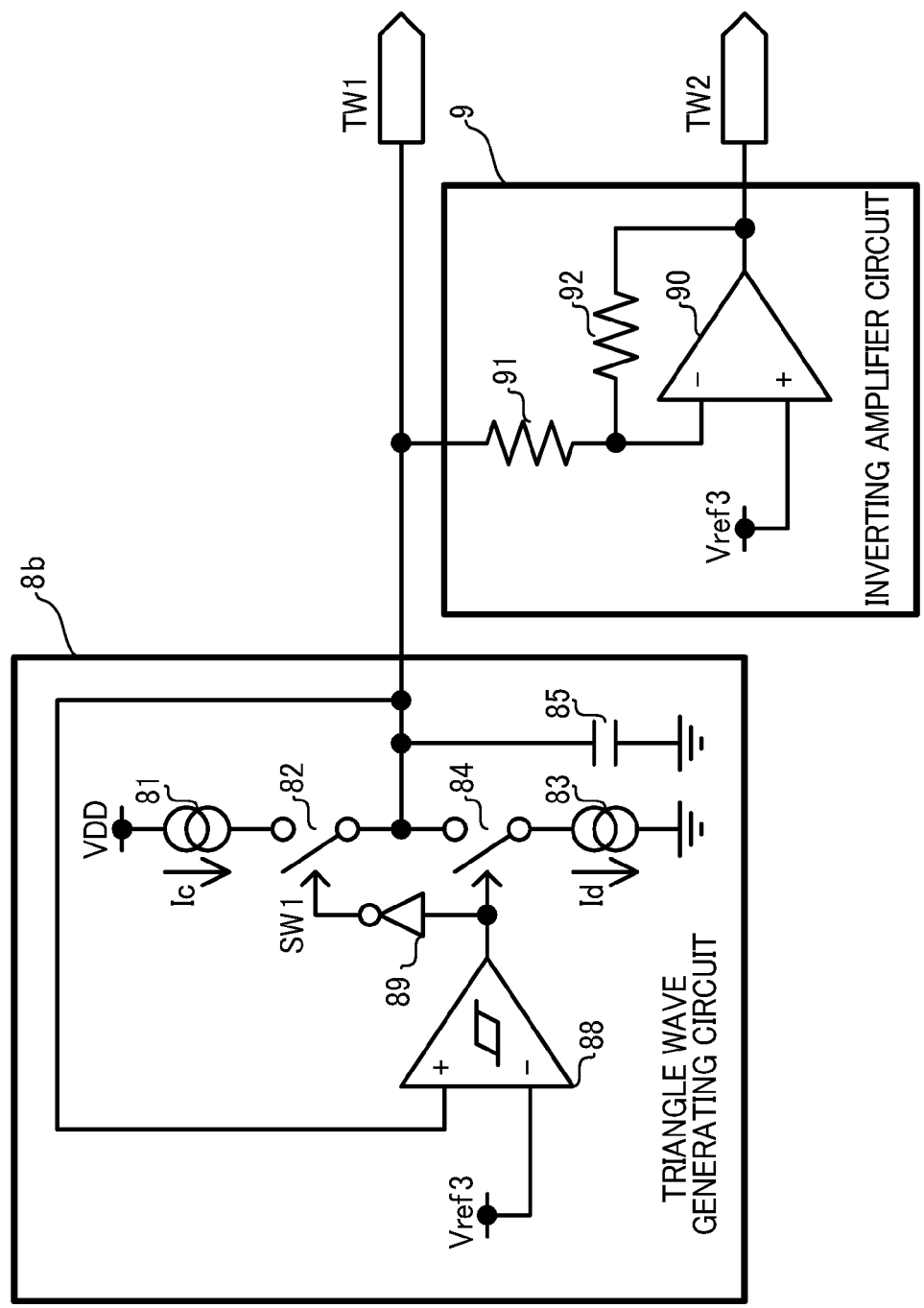
FIG. 14 is a circuit block diagram of another configuration example of a common circuit that outputs two triangle waves with phases different from each other.
Figure 15:
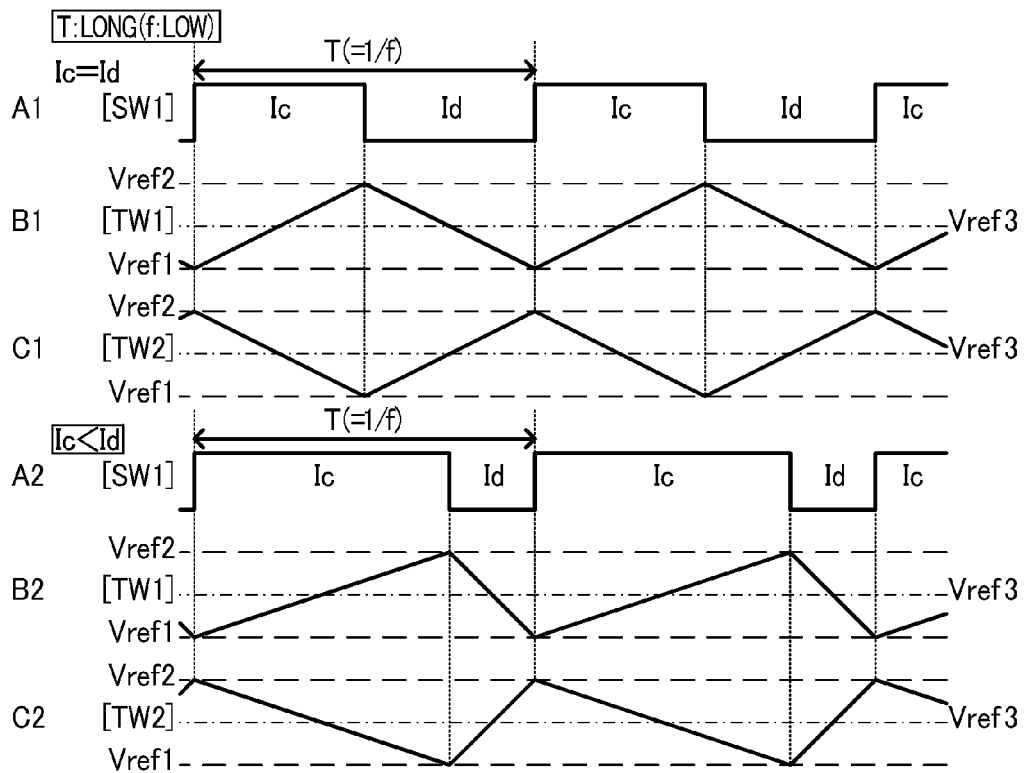
FIG. 15 is an explanatory diagram of one operation of a common circuit that outputs two triangle waves with phases different from each other.
Figure 16:
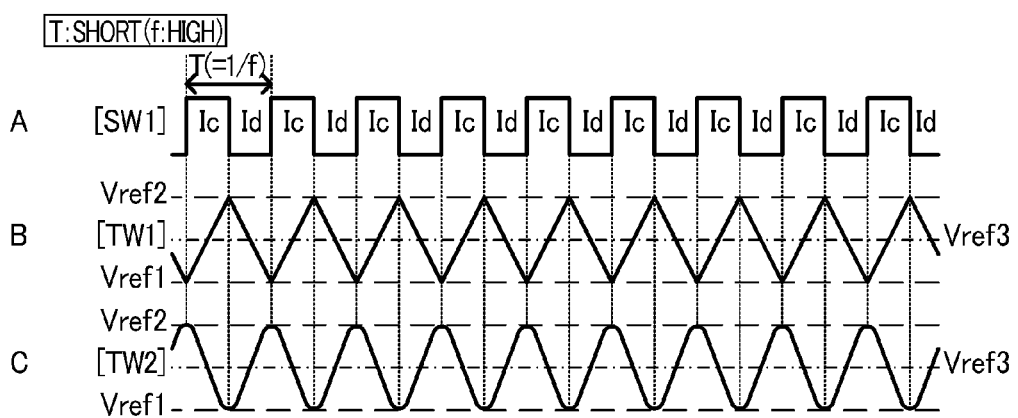
FIG. 16 is an explanatory diagram of another operation of a common circuit that outputs two triangle waves with phases different from each other.

The frequency dividing circuit 60 of the pulse generating circuit 6c frequency divides by three the clock signal CK1 with a period T illustrated in A of FIG. 12, for example, and outputs the clock signal CKM with a period 3T illustrated in B of FIG. 12, for example, to the edge detecting circuit 61 and the counter 62c. In this case, operation of the edge detecting circuit 61, the counter 62c, and the DEMUX 63c is similar to the operation in a case where the clock signal CKM is input in place of the clock signal CK1 in the pulse generating circuit 6b of a fourth embodiment of the present invention and the pulses contained in the pulse signals PW1 to PW4 output from the pulse generating circuit 6c are shifted in timing by the period 3T of the clock signal CKM from one another as illustrated in E to H of FIG. 12, for example. The charge/discharge circuits 1a to 4a output the triangle waves TW1 to TW4, respectively, that start falling at the timing of the pulses of the pulse signals PW1 to PW4, respectively, and switch it to rising when having fallen down to the reference voltage Vref1, as illustrated in I to L of FIG. 12, for example. Therefore, the triangle waves TW1 to TW4 have a period 12T, which is four times the period of the clock signal CKM, and have waveforms shifted by the period 3T of the clock signal CKM from one another.

As such, in the case of N=4 and M=3, the charge/discharge circuits 1a to 4a output the triangle waves TW1 to TW4, respectively, with the period 12T, which is the same period as that of the clock signal CK12, and the phases shifted by the period 3T, which is one fourth of the period of the clock signal CK12, namely, 90° from one another.

As described above, in the triangle wave generating circuit illustrated in FIGS. 1, 3, 5, 7, and 9, a plurality of charge/discharge circuits (1a, 1b, etc.) are supplied from the pulse generating circuit (5, 6a, etc.) with a plurality of pulse signals (PW1, PW2, etc.) with the same period and phases different from one another, and each switches between the operation of supplying the current Ic to charge the capacitor (15, 25) at a constant current value and the operation of supplying the current Id to discharge the capacitor at a constant current value, when supplied with the pulse signals and when the voltage Vc across the capacitor reaches the reference voltage (Vref1, Vref2), and thus, a plurality of charge/discharge circuits (1a, 1b, etc.) are capable of generating a plurality of triangle waves (TW1, TW2, etc.) having high frequencies with high accuracy, which have the same period and phases different from one another.

The charge/discharge circuit is capable of outputting the triangle wave, which starts rising or falling at the timing of the pulse signal, by performing control in a complementary manner so that either one of switch circuits in a pair (12 and 14, 22 and 24) for supplying the currents Ic and Id to the capacitor is turned on when the pulse signal is supplied, and the other one of switch circuits in a pair is turned on when the voltage Vc across the capacitor has reached the reference voltage.

As illustrated in FIGS. 1 and 3, the pulse generating circuit 5 is capable of supplying to the charge/discharge circuits the pulse signals PW1 and PW2 with the same period as that of the clock signal CK1 and the phases shifted by 180° from each other, by outputting from the edge detecting circuit 51 the first edge detection signal indicating the timing of the rising edge of the clock signal CK1 as the pulse and outputting from the edge detecting circuit 52 the second edge detection signal indicating the timing of the falling edge of the clock signal CK1 as the pulse.

As illustrated in FIGS. 5 and 7, the pulse generating circuit (6a, 6b) is capable of supplying to the charge/discharge circuits the pulse signals with the same period as that of the clock signal obtained by frequency dividing the clock signal CK1 by three or four and with the phases shifted by 120° or 90° from one another, by sequentially selecting any one of the charge/discharge circuits in each period T of the clock signal CK1 and outputting the edge detection signal PW0 indicating the timing of the rising edge of the clock signal CK1 as the pulse to the above selected one of the charge/discharge circuits.

The pulse generating circuit (6a, 6b) is capable of supplying to the charge/discharge circuits the pulse signals containing the pulses shifted in timing by the period T of the clock signal CK1 from one another, by sequentially selecting any one of the charge/discharge circuits according to the count value (CN3, CN4) of the counter (62a, 62b) that counts by the clock signal CK1.

As illustrated in FIG. 9, the pulse generating circuit 6c is capable of selecting the number of outputs of the plurality of triangle waves with the same period and the phases different from one another, by setting the count number N of the counter 62c at a value equal to or smaller than the number (4) of the charge/discharge circuits according to the selection signal SEL and by setting according to the selection signal SEL the frequency division ratio M of the frequency dividing circuit 60, which outputs the clock signal CKM by frequency dividing the clock signal CK1, at the value (6, 4, 3) obtained by dividing by the count number N the lowest common multiple (12) of the values (2, 3, 4), which is capable of being set as the count number N.

In an embodiments as above, each edge detecting circuit is configured as a first-order digital differential (high-pass) filter as illustrated in the edge detecting circuits 51 and 52 of FIGS. 1 and 3, as an example, but this is not limitative. Each edge detecting circuit is a circuit that outputs the edge detection signal indicating, as a pulse, the timing of either one of the rising edge, and the falling edge of the clock signal input thereto and may be configured to detect the edge using an analog filter or configured to prevent malfunction caused by noises using results of a plurality of times of sampling, for example.

In third to fifth embodiments of the present invention described above, each charge/discharge circuit has a configuration similar to those of the charge/discharge circuits 1a and 2a in a first embodiment of the present invention, but is not limitative. In third to fifth embodiments of the present invention, each charge/discharge circuit may have a configuration similar to those of the charge/discharge circuits 1b and 2b in a second embodiment of the present invention.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A triangle wave generating circuit comprising:
   a pulse generating circuit configured to generate a plurality of pulse signals with the same period and with phases different from one another; and
   a plurality of charge/discharge circuits configured to be supplied respectively with the plurality of pulse signals, the plurality of charge/discharge circuits each including:
   a current supply circuit configured to supply to a capacitor a first current for charging at a predetermined current value or a second current for discharging at a predetermined current value; and
   a charge/discharge control circuit configured to switch between the first current and the second current when the pulse signals are supplied thereto and when a voltage across the capacitor reaches a predetermined reference voltage, the first current and the second current supplied from the current supply circuit to the capacitor,
   each charge/discharge circuit outputting the voltage across the capacitor as a triangle wave signal;
   the plurality of charge/discharge circuits outputting a respective plurality of triangle wave signals having the same period and with phases different from one another.

2. The triangle wave generating circuit of claim 1, wherein the charge/discharge control circuit includes:
   switch circuits in a pair configured to supply the first current and the second current to the capacitor, respectively; and
   a switch control circuit configured to turn on or off the switch circuits in the pair in a complementary manner, and wherein
   the switch control circuit turns on either one of the switch circuits in the pair when the pulse signals are supplied thereto and turns on the other one of the switch circuits in the pair when the voltage across the capacitor reaches the predetermined reference voltage.

3. The triangle wave generating circuit of claim 1, wherein the pulse generating circuit includes:
   a first edge detecting circuit configured to output a first edge detection signal indicating, as a pulse, timing of a rising edge of a clock signal; and
   a second edge detecting circuit configured to output a second edge detection signal indicating, as a pulse, timing of a falling edge of the clock signal, and wherein
   the first and second edge detection signals are supplied to the plurality of charge/discharge circuits as the plurality of pulse signals, respectively.

4. The triangle wave generating circuit of claim 2, wherein the pulse generating circuit includes:
   a first edge detecting circuit configured to output a first edge detection signal indicating, as a pulse, timing of a rising edge of a clock signal; and
   a second edge detecting circuit configured to output a second edge detection signal indicating, as a pulse, timing of a falling edge of the clock signal, and wherein
   the first and second edge detection signals are supplied to the plurality of charge/discharge circuits as the plurality of pulse signals, respectively.

5. The triangle wave generating circuit of claim 1, wherein the pulse generating circuit includes:
   an edge detecting circuit configured to output an edge detection signal indicating, as a pulse, timing of either one of a rising edge and a falling edge of a first clock signal; and
   an output selecting circuit configured to sequentially selects any one of the plurality of charge/discharge circuits in each period of the first clock signal, and wherein
   the edge detection signal is supplied as the pulse signal to one of the charge/discharge circuits selected by the output selecting circuit.

6. The triangle wave generating circuit of claim 2, wherein the pulse generating circuit includes:
   an edge detecting circuit configured to output an edge detection signal indicating, as a pulse, timing of either one of a rising edge and a falling edge of a first clock signal; and
   an output selecting circuit configured to sequentially selects any one of the plurality of charge/discharge circuits in each period of the first clock signal, and wherein
   the edge detection signal is supplied as the pulse signal to one of the charge/discharge circuits selected by the output selecting circuit.

7. The triangle wave generating circuit of claim 5, wherein the output selecting circuit includes a counter configured to count by the first clock signal, and sequentially selects any one of the plurality of charge/discharge circuits according to a count value of the counter.

8. The triangle wave generating circuit of claim 6, wherein the output selecting circuit includes a counter configured to count by the first clock signal, and sequentially selects any one of the plurality of charge/discharge circuits according to a count value of the counter.

9. The triangle wave generating circuit of claim 7, wherein the pulse generating circuit further includes a frequency dividing circuit configured to frequency-divide a second clock signal to be output as the first clock signal, wherein
   a count number of the counter is set at a value equal to or smaller than the number of the charge/discharge circuits according to a selection signal, and wherein
   a frequency division ratio of the frequency dividing circuit is set at a value obtained by dividing by the count number a lowest common multiple of values capable of being set as the count number, according to the selection signal.

10. The triangle wave generating circuit of claim 8, wherein
   the pulse generating circuit further includes a frequency dividing circuit configured to frequency-divide a second clock signal to be output as the first clock signal, wherein
   a count number of the counter is set at a value equal to or smaller than the number of the charge/discharge circuits according to a selection signal, and wherein
   a frequency division ratio of the frequency dividing circuit is set at a value obtained by dividing by the count number a lowest common multiple of values capable of being set as the count number, according to the selection signal.

* * * * *